United States Patent
Kim et al.

(10) Patent No.: US 7,092,298 B2
(45) Date of Patent: Aug. 15, 2006

(54) METHODS OF ERASING A NON-VOLATILE MEMORY DEVICE HAVING DISCRETE CHARGE TRAP SITES

(75) Inventors: Ki-Chul Kim, Suwon-si (KR); Nae-In Lee, Seoul (KR); Geum-Jong Bae, Incheon (KR)

(73) Assignee: Samsung Electronics, Co., Ltd., (KR)

( * ) Notice: Subject to any disclaimer, the term of this patent is extended or adjusted under 35 U.S.C. 154(b) by 50 days.

(21) Appl. No.: 10/916,716

(22) Filed: Aug. 12, 2004

(65) Prior Publication Data

US 2005/0122783 A1 Jun. 9, 2005

(30) Foreign Application Priority Data

Dec. 5, 2003 (KR) .................. 10-2003-0088252

(51) Int. Cl.
*G11C 16/04* (2006.01)
(52) U.S. Cl. .................. 365/185.29; 365/185.27; 365/185.33
(58) Field of Classification Search .................. None
See application file for complete search history.

(56) References Cited

U.S. PATENT DOCUMENTS

| | | | |
|---|---|---|---|
| 5,235,544 A * | 8/1993 | Caywood | 365/185.26 |
| 5,402,371 A * | 3/1995 | Ono | 365/185.07 |
| 5,557,565 A * | 9/1996 | Kaya et al. | 365/185.27 |
| 5,691,939 A * | 11/1997 | Chang et al. | 365/185.18 |
| 5,978,274 A * | 11/1999 | Wang | 365/185.29 |
| 6,642,586 B1 * | 11/2003 | Takahashi | 257/390 |
| 6,744,675 B1 * | 6/2004 | Zheng et al. | 365/185.28 |
| 6,747,899 B1 * | 6/2004 | Hsia et al. | 365/185.28 |
| 6,760,270 B1 * | 7/2004 | Chindalore et al. | 365/218 |
| 6,898,129 B1 * | 5/2005 | Swift et al. | 365/185.29 |
| 6,963,107 B1 * | 11/2005 | Tomiie et al. | 257/324 |
| 2002/0167844 A1 * | 11/2002 | Han et al. | 365/185.28 |

FOREIGN PATENT DOCUMENTS

| | | |
|---|---|---|
| JP | 11-307655 | 11/1999 |
| JP | WO 99/65083 | 12/1999 |
| JP | 2000-082752 | 3/2000 |

OTHER PUBLICATIONS

Chan, T.Y., et al., "A True Single-Transistor Oxide-Nitride-Oxide EEPROM Device," IEEE Electron Device Letters, vol. EDL 8, No. 3, Mar. 1987, pp. 93-95.

* cited by examiner

*Primary Examiner*—Son Mai
(74) *Attorney, Agent, or Firm*—Mills & Onello LLP

(57) ABSTRACT

Methods of erasing a non-volatile memory device having discrete charge trap sites between a semiconductor substrate and a gate include applying a negative voltage to a gate at least partially spaced apart from a semiconductor substrate by a charge storage layer providing discrete charge trap sites. A first positive voltage is applied to a source formed in the semiconductor substrate adjacent to one sidewall of the gate. A second positive voltage, which is equal to or less than the first positive voltage, is applied to a drain formed in the semiconductor substrate adjacent to the gate and located opposite the source.

14 Claims, 6 Drawing Sheets

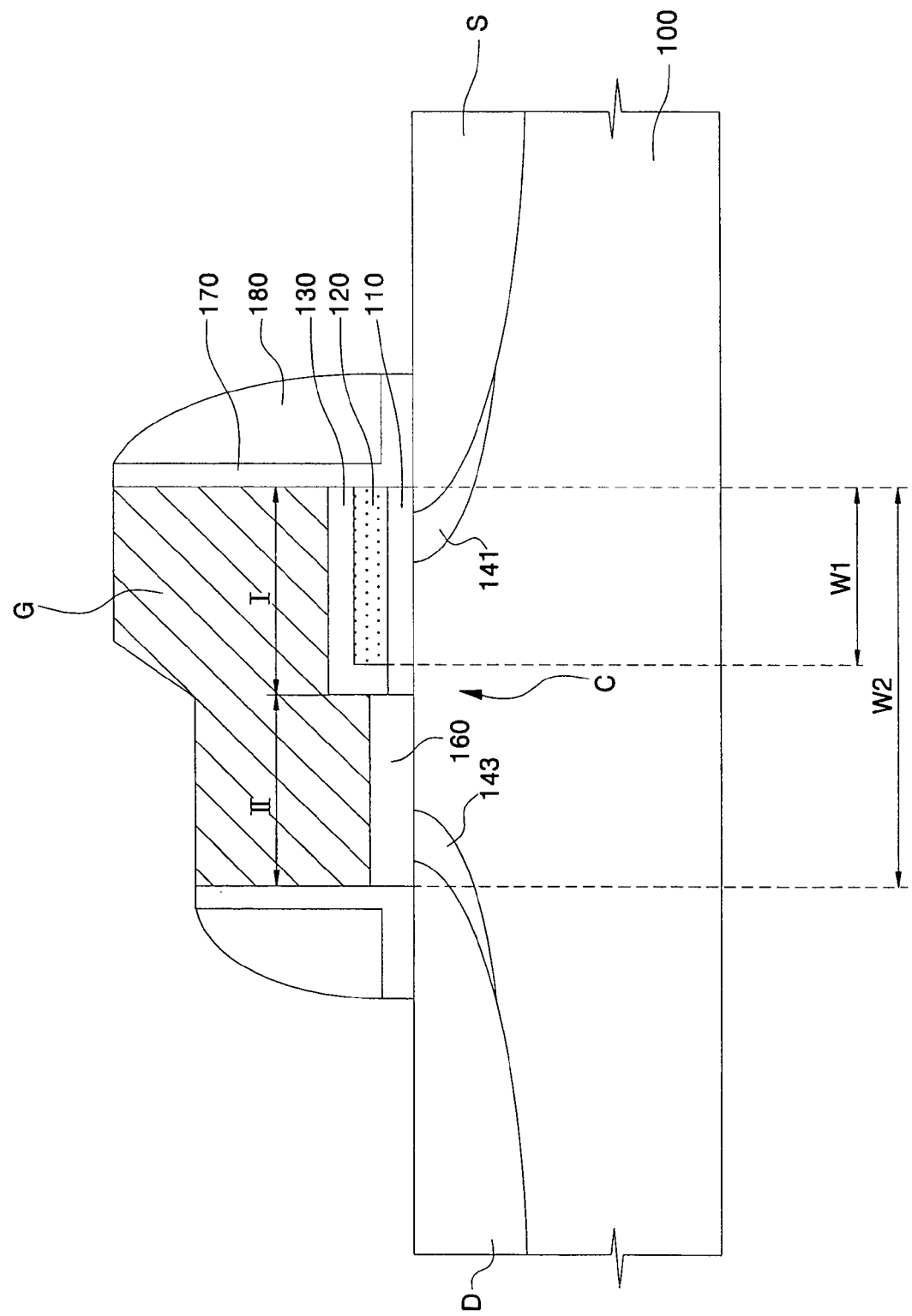

METHODS OF ERASING A NON-VOLATILE MEMORY DEVICE HAVING DISCRETE CHARGE TRAP SITES

CROSS-REFERENCE TO RELATED APPLICATION

This application claims the benefit of Korean Patent Application No. 2003-88252, filed on Dec. 5, 2003, the disclosure of which is hereby incorporated herein by reference in its entirety.

BACKGROUND OF THE INVENTION

1. Field of the Invention

The present invention relates to a non-volatile memory device and, more particularly, to methods of erasing a non-volatile memory device having discrete charge trap sites.

2. Description of the Related Art

A non-volatile memory device is configured to retain data previously stored in its memory cells, even when the power supply is turned off, unlike a volatile memory device which loses stored data when power is removed. The non-volatile memory device includes a charge storage layer, which is interposed between a semiconductor substrate and a gate. Non-volatile memory devices may be classified as a floating gate type memory device and an MNOS type memory device, depending on the structure of the charge storage layer.

The floating gate type non-volatile memory device structure includes a tunnel dielectric layer, a floating gate, an inter-gate insulating layer, and a control gate, which are sequentially stacked on a semiconductor substrate. The floating gate, in which the charge is stored, is formed of a conductive layer.

The MNOS type non-volatile memory device structure includes a stacked metal/nitride/oxide/semiconductor (MNOS) or metal/oxide/nitride/oxide/semiconductor (MONOS). In this configuration, a dielectric layer such as nitride, is interposed between a semiconductor substrate and a gate, to serve as a charge storage layer. The MNOS type non-volatile memory device stores data by using trap sites within the dielectric layer, and trap sites in an interface of the dielectric layer, for example, the interface between adjacent dielectric layers, and trap sites in an interface between the dielectric layer and the semiconductor substrate.

Chan, et. al. introduced SONOS (silicon oxide nitride oxide silicon)-type memory devices in "A True Single-Transistor Oxide-Nitride-Oxide EEPROM Device, IEEE Electron Device Letters, Vol. 8, No. 3, pp. 93–95, 1987). The conventional SONOS type non-volatile memory device includes a dielectric layer and a gate, which are formed on a silicon substrate, and source/drain formed in the semiconductor substrate adjacent to both sidewalls of the gate. The dielectric layer includes a tunnel dielectric layer, a charge storage dielectric layer, and a blocking dielectric layer. The tunnel dielectric layer, the charge storage dielectric layer and the blocking dielectric layer may be formed of a silicon oxide layer, a silicon nitride layer and a silicon oxide layer respectively. The gate may be formed of a silicon layer. That is, the SONOS structure is formed of the silicon oxide layer, the silicon nitride layer, the silicon oxide layer and silicon layer, which are sequentially stacked on the silicon substrate.

When the SONOS type non-volatile memory device becomes programmed, and electrons are injected into the charge storage dielectric layer, the device threshold voltage is increased. Thus, when a voltage, being lower than the increased threshold voltage, is applied on the gate, electric current does not flow through the channel. When a voltage higher than the threshold voltage is applied, current flows through the channel. Using this property, stored data can be read.

Furthermore, the erase operation of the SONOS type non-volatile memory device is performed by applying a negative voltage to the gate and by applying a positive voltage to the source, while floating the drain and the semiconductor substrate. As such, the electrons stored within the charge storage dielectric layer are removed. In the case where the charge storage layer is a floating gate comprising a conductive layer, the electrons stored within the charge storage layer can be freely moved. On the contrary, in the case where the charge storage layer is formed of a dielectric layer, such as in the case of the SONOS type non-volatile memory device, the electrons stored inside the trap sites cannot be freely moved. Thus, the conventional erasing method described above fails to provide a complete erasure in such a SONOS type non-volatile memory device.

FIG. 1 is a graph showing the change of threshold voltage as a function of the number of program(P)/erase(E) cycles in the typical SONOS type non-volatile memory device. As shown in FIG. 1, while program threshold voltages remain somewhat constant as a function of the number of program/erase operations, the erase threshold voltages are gradually increased. Such an increase of the erase threshold voltages results from the fact that the electrons trapped within the charge storage layer are not completely removed as a result of the erase operation, as described above. If the increase in erase threshold voltage cannot be suppressed, after approximately 100,000 P/E cycles, a threshold voltage window between a programmed non-volatile memory device and a non-programmed non-volatile memory device is not obtained, thereby resulting in deterioration of device reliability.

SUMMARY OF THE INVENTION

The present invention is directed to methods of erasing non-volatile memory devices having discrete charge trap sites by which program/erase endurance characteristics are improved.

In a first aspect, the present invention is directed to a method of erasing a non-volatile memory device, for example an N-channel device. A negative voltage is applied to a gate at least partially spaced apart from a semiconductor substrate by a charge storage layer providing discrete charge trap sites. A first positive voltage is applied to a source formed in the semiconductor substrate adjacent to one sidewall of the gate. A second positive voltage, which is equal to or less than the first positive voltage, is applied to a drain formed in the semiconductor substrate adjacent to the gate and located opposite the source.

In one embodiment, the second positive voltage is in the range of 1 V to 5 V, or in the range of 2 V to 4 V. A negative voltage can be applied to the semiconductor substrate. The voltage applied to the semiconductor substrate is greater than the voltage applied to the gate. In another embodiment, a ground voltage is applied to the semiconductor substrate, or the substrate is floated.

In another embodiment, the charge storage layer is relatively closer to the source than the drain.

In a second aspect, the present invention is directed to a method of erasing a non-volatile memory device, for example a P-channel device. A positive voltage is applied to a gate at least partially spaced apart from a semiconductor substrate by a charge storage layer providing discrete charge trap sites. A first negative voltage is applied to a source formed in the semiconductor substrate adjacent to one sidewall of the gate. A second negative voltage, which is equal to or greater than the first negative voltage, is applied to a drain formed in the semiconductor substrate adjacent to the gate and located opposite the source.

In one embodiment, the second negative voltage is in the range of −1 V to −7 V, for example, in the range of −1 V to −5 V. A positive voltage can be applied to the semiconductor substrate. The voltage applied to the semiconductor substrate is less than the voltage applied to the gate. In another embodiment, a ground voltage is applied to the semiconductor substrate, or the substrate is floated.

In another embodiment, the charge storage layer is relatively closer to the source than the drain.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A and 2B are sectional views illustrating a structure of a non-volatile memory device employing an erasing method according to the present invention;

DETAILED DESCRIPTION OF THE INVENTION

Figure 1:
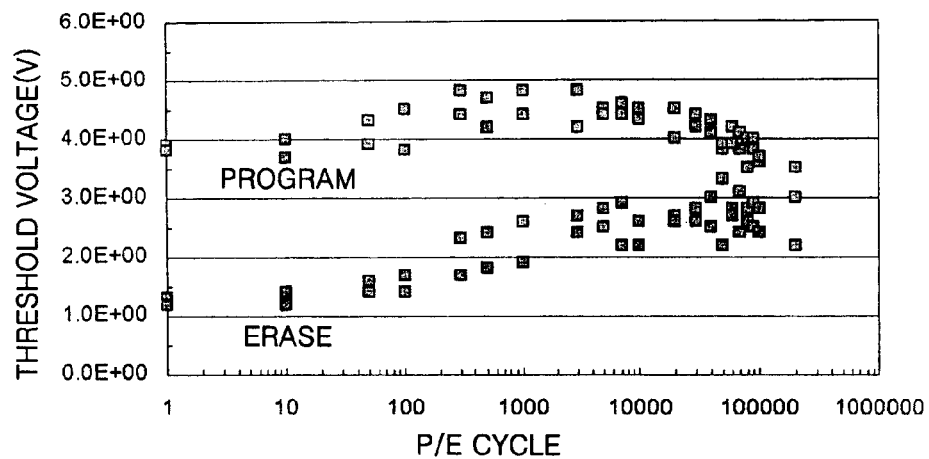
FIG. 1 is a graph showing the change of program and erase threshold voltages in accordance with program/erase cycles in a non-volatile memory device having a typical SONOS structure.
Figure 2A:
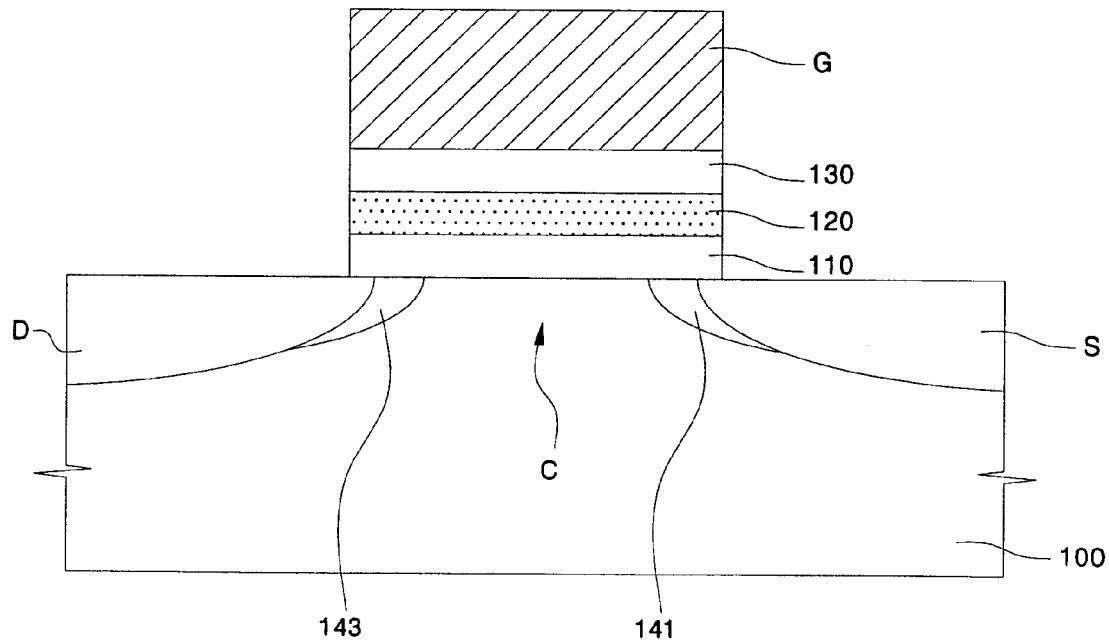

FIGS. 2A and 2B are sectional views illustrating a structure of a non-volatile memory device employing an erasing method according to the present invention. Referring to FIG. 2A, a non-volatile memory device employing an erasing method according to the present invention includes a gate G formed over a semiconductor substrate 100, source/drain S/D structures formed in the semiconductor substrate 100 adjacent to both sidewalls of the gate G and spaced apart from each other by a channel region C disposed between them, and a charge storage layer 120 interposed between the semiconductor substrate 100 and the gate G, for providing discrete charge trap sites. In one embodiment, the semiconductor substrate 100 has a conductivity that is opposite that of the source/drain S/D. The channel region C comprises an N-channel or a P-channel depending on the conductivity of the source/drain S/D. The gate G overlaps an end portion of the source S and/or drain D.

In one embodiment, the non-volatile memory device further includes a pocket ion implantation region 141, which is formed in the semiconductor substrate 100 between the channel region C and the source S. Also, the non-volatile memory device further includes an optional pocket ion implantation region 143, which is formed in the semiconductor substrate 100 between the channel region C and the drain D.

Alternatively, as shown in FIG. 2B, the non-volatile memory device employing the erasing method of the present invention may have a charge storage layer 120, which is interposed between the semiconductor substrate 100 and the gate G, and covers a portion of the channel region C, and is relatively closer to the source S than the drain D. The charge storage layer 120 provides discrete charge trap sites. Preferably, a width W1 of the charge storage layer 120 is not greater than ½ the width W2 of the gate G. The gate G covers both the charge storage region I and the non-charge storage region II, as shown. A gate insulating layer 160 is interposed between the gate G of the non-charge storage region II and the semiconductor substrate 100, near the charge storage layer 120. Spacers 170, 180 are formed on the sidewalls of the gate G.

As shown in FIGS. 2A and 2B, the non-volatile memory device further includes a tunnel dielectric layer 110 interposed between the charge storage layer 120 and the semiconductor substrate 100, and a blocking dielectric layer 130 interposed between the charge storage layer 120 and the gate G. In one embodiment, the tunnel dielectric layer 110 and the blocking dielectric layer 130 are formed of an oxide layer.

Figure 3A:
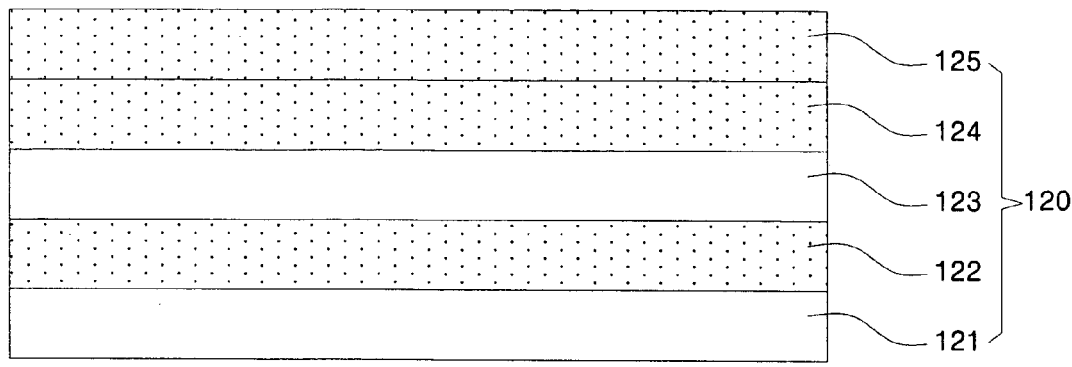
FIGS. 3A to 3C are sectional views illustrating a structure of a charge storage layer of a non-volatile memory device employing an erasing method according to the present invention.

The charge storage layer 120 is formed of one layer or a combination of at least two layers selected from the group consisting of a silicon oxide layer, a silicon oxide nitride layer, a lanthanum aluminum oxide layer, a zirconium oxide layer, an aluminum oxide layer and a hafnium oxide layer. In another embodiment, the charge storage layer 120 comprises a stacked structure including a thermal oxide layer and a medium temperature oxide layer. The charge storage layer 120 preferably has additional interfaces in order to increase the charge trap sites. For the reason, the charge storage layer 120 may comprise a stacked structure including at least one oxide layer and at least one nitride layer. That is, an oxide layer and a nitride layer may be alternately stacked, so as to form a structure such as ONONO (oxide-nitride-oxide-nitride-oxide), NONONO or the like. Alternatively, the oxide layer and a nitride layer can be stacked without a predetermined order. That is, as shown in FIG. 3A, the charge storage layer 120 may have a structure that an oxide layer 121, a nitride layer 122, an oxide layer 123, a nitride layer 124, and a nitride layer 125 are stacked.

Figure 3B:
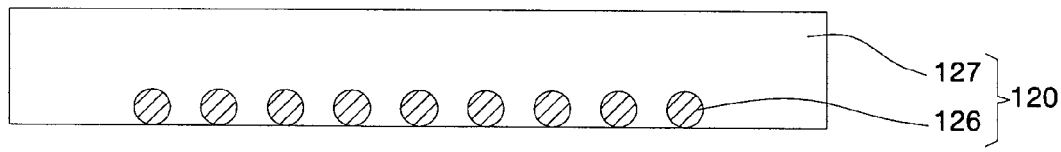
Figure 3C:
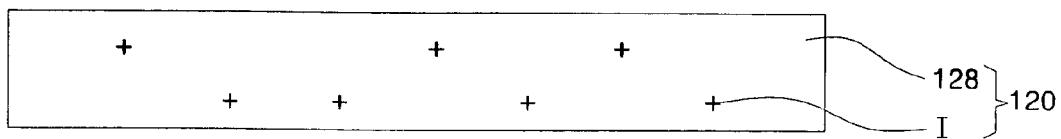

Further, as shown in the embodiment of FIG. 3B, the charge storage layer 120 can optionally include nanocrystalline silicon particles 126 and a dielectric layer 127 covering the nanocrystalline silicon particles 126. An average diameter of a nanocrystalline silicon particle 126 may be in the range of 10 Å to 100 Å. In another embodiment, as shown in FIG. 3C, the charge storage layer 120 includes a dielectric layer 128 having suspended ions I. The ions I may comprise, for example, Al ions, Si ions or As ions.

The conductivity of the pocket ion implantation regions 141, 143 of the non-volatile memory device as shown in FIGS. 2A and 2B is identical to that of the semiconductor substrate 100, and the doping density thereof is higher than that of the semiconductor substrate 100. The pocket ion implantation regions 141, 143 are formed in one embodiment by injecting ions at a tilt angle, which does not exceed 45° with respect to a normal line of the semiconductor substrate 100. The pocket ion implantation regions 141, 143 are formed to enhance program/erase efficiency. With the presence of the pocket ion implantation regions 141, 143, a short channel effect of the resulting transistor may be suppressed. That is, the pocket ion implantation regions 141, 143 operate to locally increase the threshold voltage, in order to prevent punch-through.

The following description is related to erasing methods of a non-volatile memory device according to embodiments of the present invention. First, with reference to FIGS. 2A and 2B, an erasing method is now described, for an example in which a non-volatile memory device having a charge storage layer 120 providing discrete charge trap sites has an N-channel.

In this example, electrons, which are stored inside the charge storage layer 120, are removed by applying a negative voltage to the gate G, and by applying a positive voltage to the source S and the drain D. For example, a voltage in the range of −4 V to −10 V is applied to the gate G. More preferably, a voltage in the range of −5 V to −7 V is applied to the gate G. At the same time, a voltage in the range of 3 V to 9 V is applied to the source S. More preferably, a voltage in the range of 4 V to 6 V is applied to the source S. In one embodiment, the voltage applied to the drain D is equal to or less than the voltage applied to the source S. For example, a voltage in the range of 1 V to 5 V is applied to the drain D. More preferably, a voltage in the range of 2 V to 4 V is applied to the drain D. The semiconductor substrate 100 can be floated, or a ground voltage (0 V) or a negative voltage can be applied to the semiconductor substrate 100. A voltage in the range of −0.5 V to −3 V can be applied to the semiconductor substrate 100. More preferably, a voltage in the range of −0.5 V to −2 V is applied to the semiconductor substrate 100. In one embodiment, the voltage applied to the semiconductor substrate 100 is greater than the voltage applied to the gate G. That is, the electric potential difference between the source/drain S/D and the gate G is greater than an electric potential difference between the source/drain S/D and the semiconductor substrate 100.

As described above, according to the present invention, in an erasing operation of an N-channel memory device, the electrons trapped within the charge storage layer 120 can be more effectively removed by applying a positive voltage to the drain D as well as to the source S. That is, since hot holes are injected from the drain D into the charge storage layer 120, and since hot holes are also injected from the source S into the charge storage layer 120, erase efficiency is improved. Furthermore, in the N-channel non-volatile memory device as shown in FIG. 2B, in which a portion of the gate G overlaps the charge storage region I, even those electrons which happen to be trapped in the gate insulating layer 160 of the non-charge storage region II, and trapped in the interface of the gate insulating layer 160 and the semiconductor substrate 100, are removed, so as to further improve erase efficiency.

Further, according to the present invention, erase efficiency is further improved by applying a negative voltage to the semiconductor substrate 100 during erasing. That is, in the structure of the non-volatile memory device as shown in FIGS. 2A and 2B, compared with the case of applying 0 V of voltage to the semiconductor substrate 100, the electric potential difference between the source S and the semiconductor substrate 100, and the electric potential difference between the drain D and the semiconductor substrate 100 are further increased by applying a negative voltage to the semiconductor substrate 100. In this manner, BTBT (band to band tunneling) is increased. With the increase in BTBT, a BTBT electric current flows from the source S and the drain D into the semiconductor substrate 100, and, at the same time, hot holes and hot electrons are generated. In the case where the voltage applied to the gate G is lower than the voltage applied to the semiconductor substrate 100, hot holes are injected into the charge storage layer 120, and hot electrons are injected into the source S and the drain D. Thus, with the increase of BTBT, the hot holes, which are injected into the charge storage layer 120, are increased, and as a result, device erase characteristics are improved.

According to another embodiment of the present invention, an erasing method is now described, for an example in which a non-volatile memory device having a charge storage layer 120 providing discrete charge trap sites has a P-channel.

Again with reference to FIGS. 2A and 2B, holes, which are stored inside the charge storage layer 120, are removed by applying a positive voltage to the gate G, and by applying a negative voltage to the source S and the drain D. In this embodiment, a voltage in the range of 4 V to 9 V is applied to the gate G. More preferably, a voltage in the range of 5 V to 8 V is applied to the gate G. At the same time, a voltage in the range of −4 V to −8 V is applied to the source S. More preferably, a voltage in the range of −5 V to −7 V is applied to the source S. In one embodiment, the voltage applied to the drain D is equal to or greater than the voltage applied to the source S. For example, a voltage in the range of −1 V to −7 V is applied to the drain D. More preferably, a voltage in the range of −1 V to −5 V is applied to the drain D. The semiconductor substrate 100 can be floated, or a ground voltage (0 V) or a positive voltage can be applied thereto. For example a voltage in the range of 0.5 V to 3 V can be applied to the semiconductor substrate 100. More preferably, a voltage in the range of 0.5 V to 2 V is applied to the semiconductor substrate 100. In one embodiment, the voltage applied to the semiconductor substrate 100 is lower than the voltage applied to the gate G.

Figure 4A:
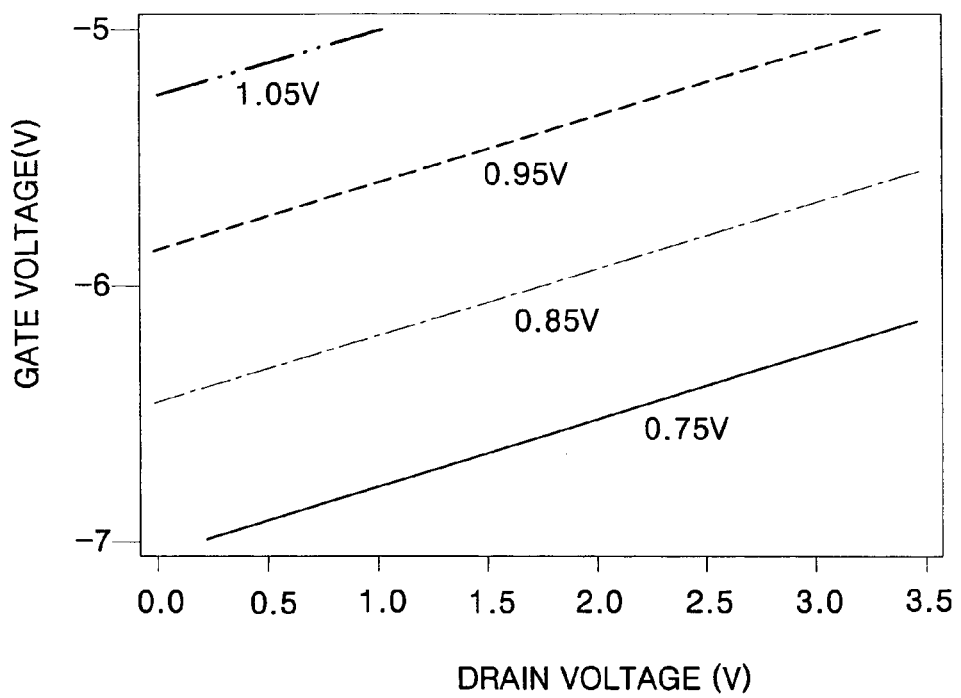
FIGS. 4A and 4B are graphs of drain voltages versus gate voltages illustrating erase characteristics according to the erasing methods of the present invention.

FIG. 4A shows the results of the relationships between drain voltages and gate voltages during erasing for the non-volatile memory device, in the configuration where only a portion of the channel region C overlaps the charge storage layer 120, as shown in FIG. 2B. The result shown in FIG. 4A is obtained by applying a voltage in the range of 0.0 V to 3.5 V to the drain D of the non-volatile memory device having an N-channel, and applying a voltage in the range of −5 V to −7 V to the gate G. Here, the erasing operation is performed over a time span of 2 ms by applying 5.5 V to the source S, and by applying 0.0 V to the semiconductor substrate 100.

As shown in FIG. 4A, as the positive voltage applied to the drain during the erasing operation is increased, an erase operation can occur, even in the range of lower gate voltages. Thus, unlike the conventional approach of floating the drain during erasing, the present invention provides the effect of improving erase speed, by applying a positive voltage to the drain of a non-volatile memory device having an N-channel.

In the meantime, as shown in FIG. 4A, a complete erasure has not occurred under the erase conditions provided above. In the above erase conditions, the difference between the desired threshold voltage of an erased non-volatile memory device and the actual threshold voltage is 0.75 V, 0.85 V, 0.95 V and 1.05 V, which are all greater than 0 V. That is, a complete erasure has not occurred.

Figure 4B:
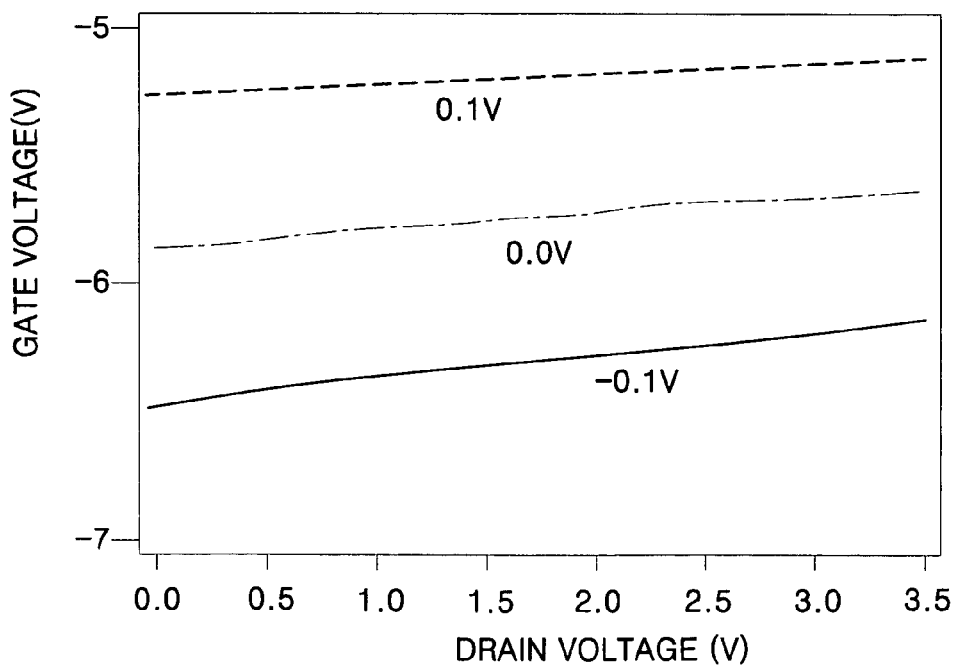

Alternatively, when an erase operation is performed under the conditions described above and further by changing the voltage applied to the semiconductor substrate to −1.5 V, a new result is obtained as shown in FIG. 4B. As such, by applying a negative voltage to the semiconductor substrate of the non-volatile memory device having an N-channel, the difference between the desired threshold voltage of an erased non-volatile memory device after erasing and the actual threshold voltage is 0.1 V, 0.0 V and −0.1 V. That is, the difference of the incomplete erasure (0.1 V) is smaller than the result of FIG. 4A, and further, it provides results of a complete erase (0.0 V) and an over erase (−0.1 V).

Therefore, based on the comparison of FIGS. 4A and 4B, it has been determined that erase operation speed and erase characteristics are further improved by applying a negative voltage to the semiconductor substrate.

Figure 5A:
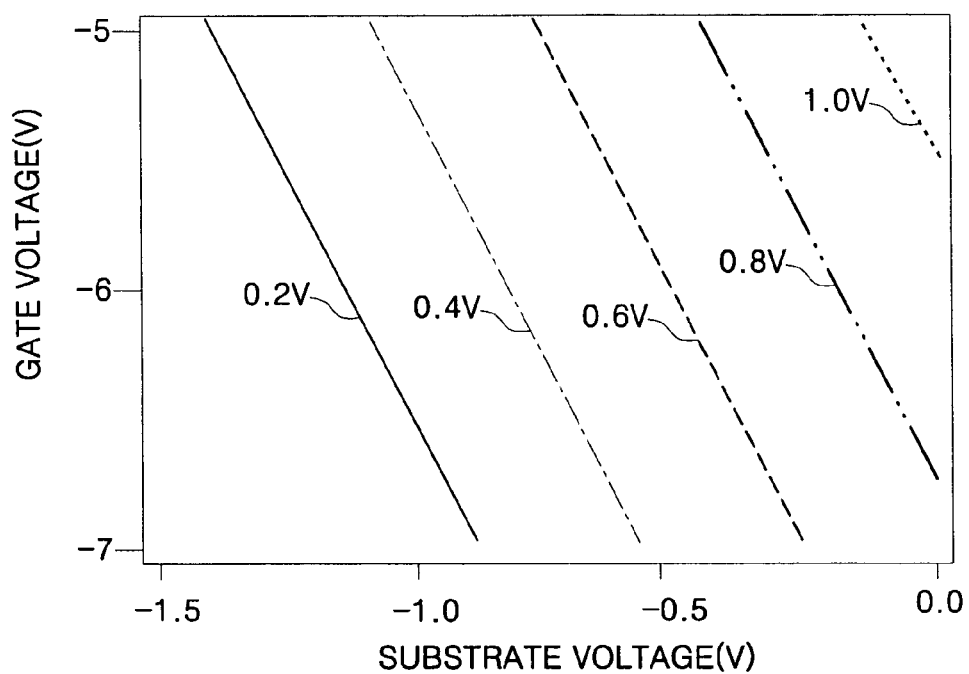
FIGS. 5A and 5B are graphs of substrate voltages versus gate voltages illustrating erase characteristics according to the erasing methods of the present invention.

FIG. 5A shows the result of the relationships between substrate voltages and gate voltages during erasing of the non-volatile memory device, in which only a part of the channel region C overlaps the charge storage layer 120, as shown in FIG. 2B. The result shown in FIG. 5A is obtained by applying a voltage in the range of 0 V to −1.5 V to the semiconductor substrate 100 of the non-volatile memory device having an N-channel, and by applying a voltage in the range of −5 V to −7 V to the gate G. Here, the erasing is performed for 2 ms by applying 5.5 V of constant source voltage (Vs) to the source S, and by applying 0.0 V of voltage to the drain D. As shown in FIG. 5A, the difference between the desired threshold voltage of an erased non-volatile memory device and the actual threshold voltage is 0.2 V, 0.4 V, 0.6 V, 0.8 V and 1.0 V, and a complete erasure has therefore not occurred; however, the erase operation speed has been improved by applying a negative voltage on the substrate during erasing.

Figure 5B:
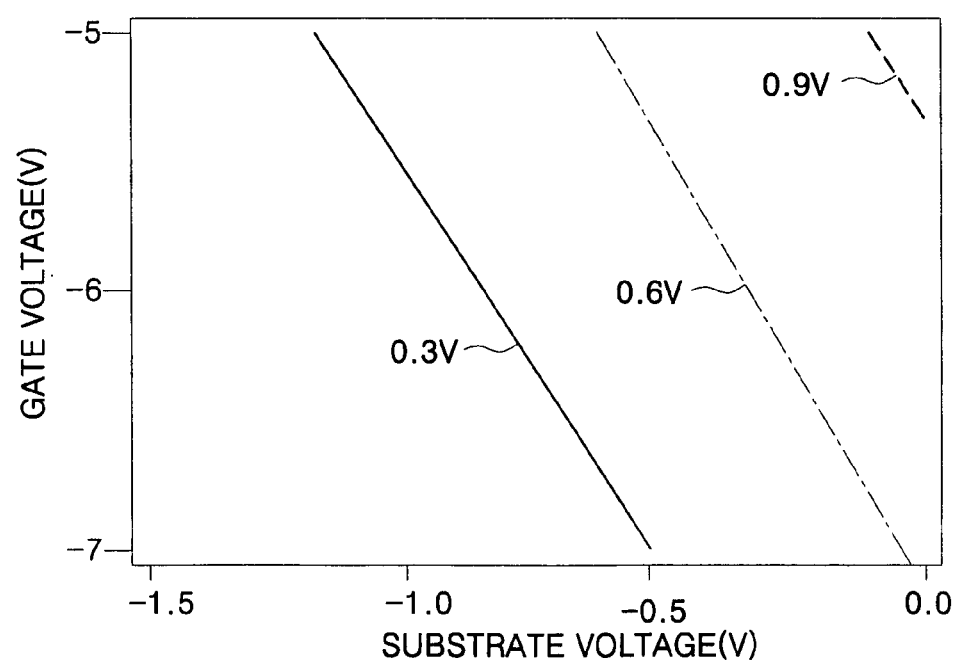

Alternatively, when the erase operation described above with respect to FIG. 5A is performed by further raising the drain voltage to 3.5 V, a new result is obtained as shown in FIG. 5B. As such, by applying a positive voltage to the drain of a non-volatile memory device having an N-channel, the speed of the erase operation is further improved. That is, in comparing the results of FIGS. 5A and 5B, in which the erase operation has occurred with the same result (0.6 V), it has been determined that the erase operation occurs more quickly when a positive voltage is applied to the drain.

Furthermore, based on the conditions which provided the results shown in FIGS. 4A and 4B, ranges of gate voltage levels and drain voltage levels are obtained that are capable of providing improved erase characteristics. The results shown in FIGS. 6A and 6B were obtained from the results of FIGS. 4A and 4B respectively, and show the range providing good erase characteristics (referred to as "good range A"), and the range providing bad erase characteristics (referred to as "bad range B"). An upper limit and a lower limit of the good range A have been determined under the condition that the difference between the desired threshold voltage of the erased non-volatile memory device and the actual threshold voltage is 0.0 V and −0.2 V. The upper limit and the lower limit may be determined according to a different range of threshold voltage levels, depending on the characteristics and the application of the non-volatile memory device, and accordingly, ranges of the good range A and the bad range B may be changed.

Figure 6A:
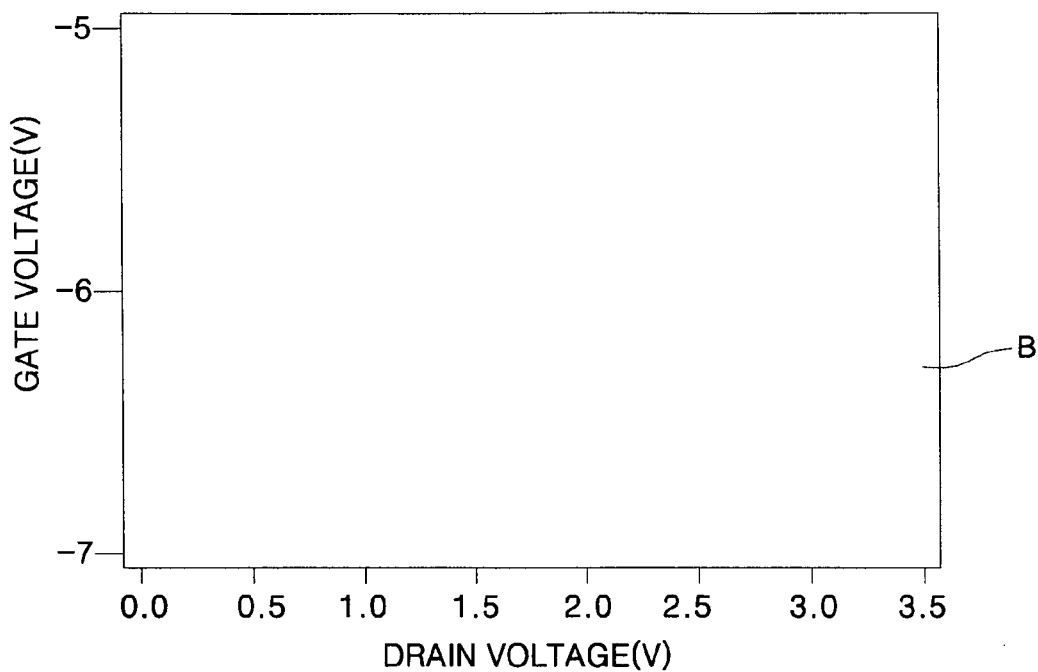
FIGS. 6A and 6B are graphs of drain voltages versus gate voltages illustrating ranges of drain voltages and gate voltages in order to obtain effective erasing results.
Figure 6B:
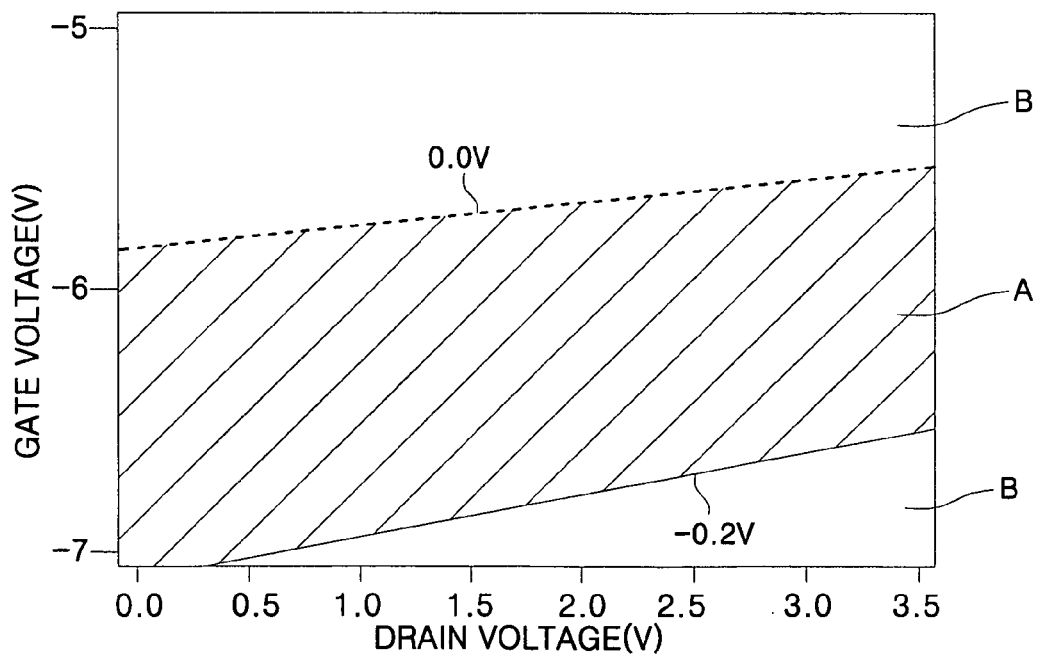

In the case where the substrate voltage is 0 V during the erase operation, as shown in FIG. 6A, the levels of gate voltages and drain voltages, which may provide good erase characteristics, belonged entirely to the bad range B, even in the same erase conditions for applying gate voltages, source voltages, and drain voltages. On the contrary, in the case where the substrate voltage is −1.5 V as shown in FIG. 6B, the levels of gate voltages and drain voltages, which may provide good erase characteristics, belonged to the good range A.

Therefore, according to the present invention, erase characteristics of a non-volatile memory device having a charge storage layer for providing discrete charge trap sites are improved. Accordingly, an improvement in program/erase endurance characteristics is also achieved.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of erasing a non-volatile memory device comprising:
   a) applying a negative voltage to a gate at least partially spaced apart from a semiconductor substrate by a charge storage layer providing discrete charge trap sites;
   b) applying a first positive voltage to a source formed in the semiconductor substrate adjacent to one sidewall of the gate;
   c) applying a second positive voltage, which is equal to or less than the first positive voltage, to a drain formed in the semiconductor substrate adjacent to the gate and located opposite the source; and
   d) applying a negative voltage to the semiconductor substrate.

2. The method according to claim 1, wherein the second positive voltage is in the range of 1 V to 5 V.

3. The method according to claim 2, wherein the second positive voltage is in the range of 2 V to 4 V.

4. The method according to claim 1, wherein the negative voltage applied to the semiconductor substrate is greater than the voltage applied to the gate.

5. The method according to claim 1, wherein the charge storage layer is relatively closer to the source than the drain.

6. The method according to claim 5, wherein the voltage applied to the semiconductor substrate is greater than the voltage applied to the gate.

7. The method according to claim 1 wherein the non-volatile memory device is an N-channel device.

8. A method of erasing a non-volatile memory device comprising:
   a) applying a positive voltage to a gate at least partially spaced apart from a semiconductor substrate by a charge storage layer providing discrete charge trap sites;
   b) applying a first negative voltage to a source formed in the semiconductor substrate adjacent to one sidewall of the gate;
   c) applying a second negative voltage, which is equal to or greater than the first negative voltage, to a drain formed in the semiconductor substrate adjacent to the gate and located opposite the source; and
   d) applying a positive voltage to the semiconductor substrate.

9. The method according to claim 8, wherein the second negative voltage is in the range of −1 V to −7 V.

10. The method according to claim 9, wherein the second negative voltage is in the range of −1 V to −5 V.

11. The method according to claim 8, wherein the positive voltage applied to the semiconductor substrate is less than the voltage applied to the gate.

12. The method according to claim 8, wherein the charge storage layer is relatively closer to the source than the drain.

13. The method according to claim 12, wherein the positive voltage applied to the semiconductor substrate is less than the voltage applied to the gate.

14. The method according to claim 8 wherein the non-volatile memory device is a P-channel device.

* * * * *